United States Patent [19]
Morrell

[11] Patent Number: 5,734,774
[45] Date of Patent: Mar. 31, 1998

[54] OUTDOOR ELECTRONICS CABINET

[75] Inventor: Edward Albert Morrell, Randolph Township, Morris County, N.J.

[73] Assignee: Lucent Technologies Inc., Murray Hill, N.J.

[21] Appl. No.: 565,541

[22] Filed: Nov. 30, 1995

[51] Int. Cl.⁶ ................................................ G02B 6/00
[52] U.S. Cl. ........................... 385/134; 385/135; 385/137
[58] Field of Search ................................. 385/134–140; 361/690

[56] References Cited

U.S. PATENT DOCUMENTS 5,412,497  5/1995  Kaetsu et al. ................. 385/134 X
5,442,726  8/1995  Howard et al. ................... 385/135
5,608,609  3/1997  Morrell .............................. 361/690

Primary Examiner—Phan T. H. Palmer

[57] ABSTRACT

Disclosed is an electronics cabinet for mounting on the ground while preventing excessive strain on electrical or optical conductors passing into and out of the cabinet. The conductors are arranged on equipment such as a fiber organizer which is mounted to the cabinet housing by means of magnets so that the organizer will slide with respect to the housing in the event that the cabinet moves due to changes in ground temperature.

5 Claims, 3 Drawing Sheets

5,734,774

OUTDOOR ELECTRONICS CABINET

FIELD OF THE INVENTION

This invention relates to electronics cabinets for mounting outdoors.

BACKGROUND OF THE INVENTION

Modern telecommunications systems and proposed combination telecommunications and broadband systems usually require sophisticated electronics to be located in the vicinity of a plurality of subscribers. This requirement necessitates an appropriate cabinet for housing the equipment which will protect the electronics from the outside elements. One example of such a cabinet is the remote terminal in a Subscriber Loop Carrier (SLC®) system. Another example is the distant terminal required in hybrid fiber coax systems which includes both narrowband and broadband equipment. (See, for example, U.S. Patent Application of Morrell, Ser. No. 08/526,618, filed Sep. 11, 1995, U.S. Pat. No. 5,608,609, and incorporated by reference herein.) Such cabinets are usually mounted on the ground, with cables including optical fibers and/or copper wires from below ground being fed into the cabinet. In the event of cold weather, the cabinets can move up and down as the ground freezes. This can put a severe strain on the fibers or conductors which are attached to the equipment in the cabinet.

SUMMARY OF THE INVENTION

The invention is a cabinet which includes a housing defining apertures for receiving conductors from below ground, and means in close proximity to the apertures for arranging the conductors. Magnetic material is provided between the arranging means and the housing so that the arranging means is mounted to slide with respect to the housing in the event of movement of the housing.

BRIEF DESCRIPTION OF THE DRAWING

These and other features are delineated in detail in the description to follow. In the drawing.

It will be appreciated that, for illustrative purposes, these figures are not necessarily drawn to scale.

DETAILED DESCRIPTION

Figure 1:
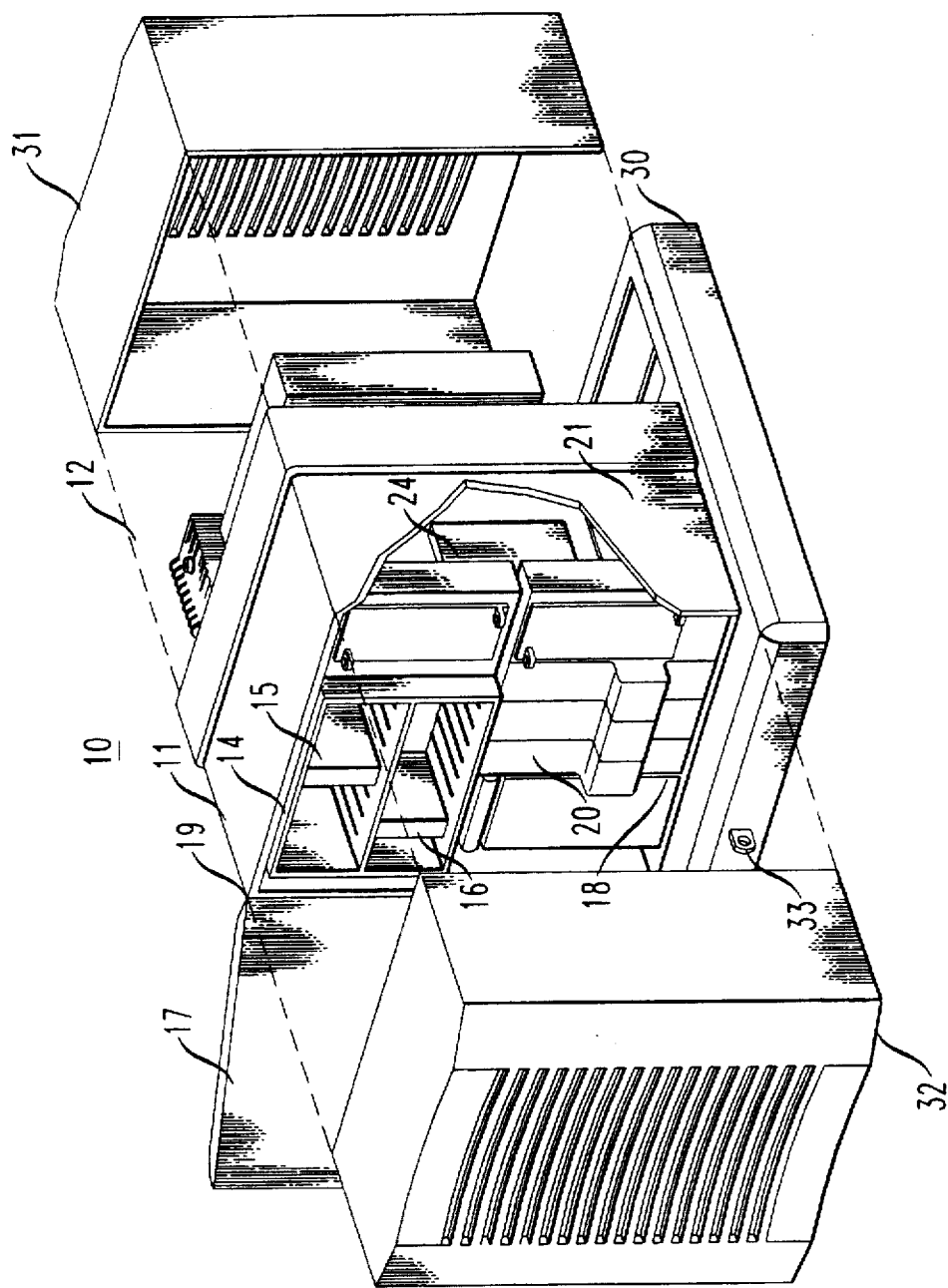
FIG. 1 is an exploded, perspective view of primarily one portion of a cabinet in accordance with an embodiment of the invention.
Figure 2:
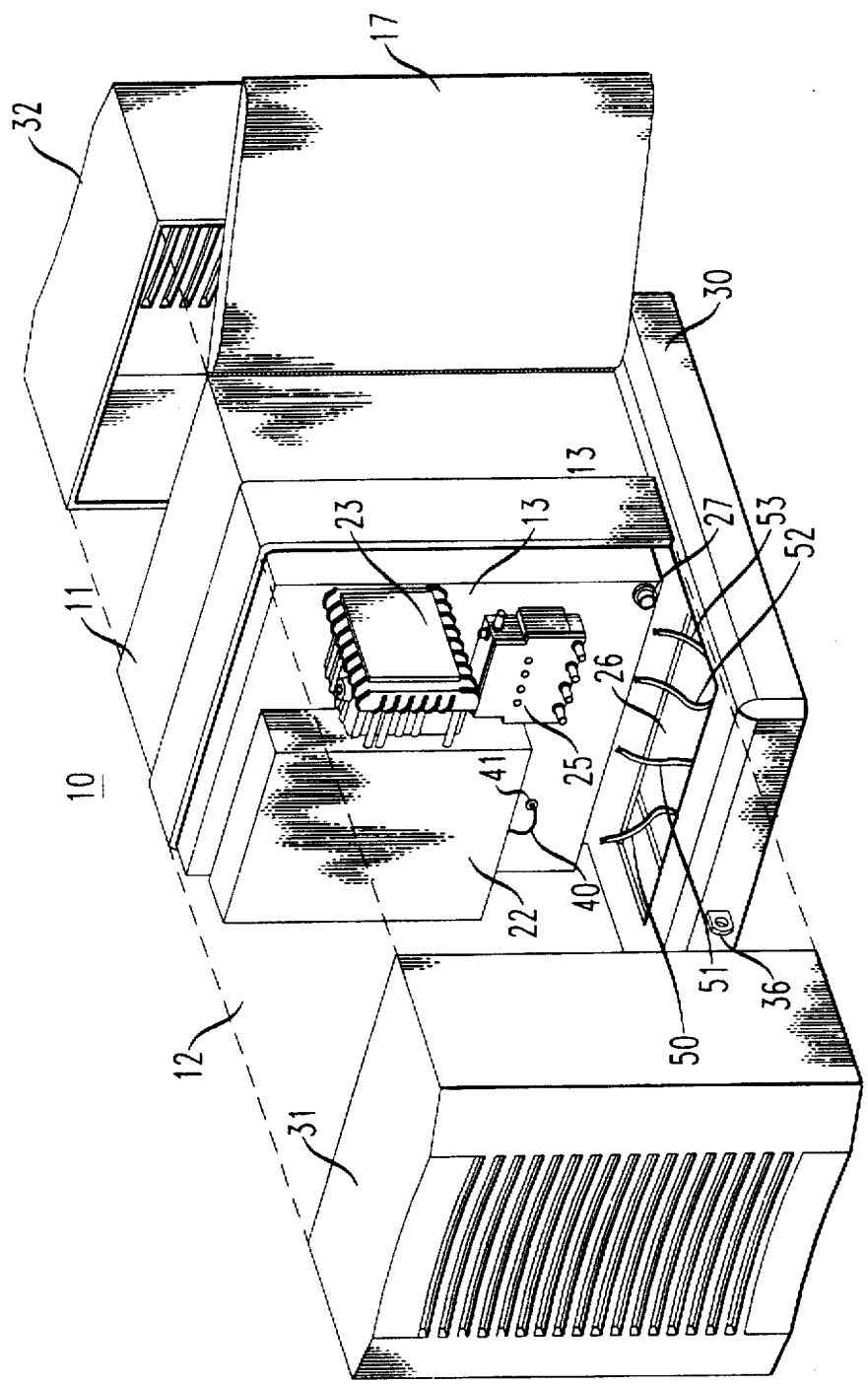
FIG. 2 is an exploded, perspective view of primarily another portion of a cabinet in accordance with the same embodiment.

Referring now to the drawings, in which like reference numerals identify similar or identical elements, FIGS. 1 and 2 illustrate a cabinet, 10, which is also described in further detail in U.S. Patent Application of Morrell, Ser. No. 08/526, 618, filed Sep. 11, 1995, U.S. Pat. No. 5,608,609, and incorporated by reference herein. The cabinet, 10, includes two portions, 11 and 12, which are preferably adjacent and separated by a wall, 13. Portion, 11, includes therein a plurality of shelves, e.g., 14 and 18, within which are mounted a plurality of standard circuit packs, e.g., 15 and 16. In this example, the upper shelf, 14, includes the circuit packs, e.g., 15 and 16, for narrowband transmission, and the lower shelf, 18, includes the circuit packs, e.g., 20, for broadband transmission. Of course, other arrangements are possible. The circuit packs are accessed on one end of the cabinet by a door, 17, which is mounted to the rear of the cabinet by means of hinges, e.g., 19. An optical fiber organizer, 24, described in more detail below, is also mounted within portion 11. When in the closed position, the door, 17, along with the wall, 13, form a weather tight seal so that the circuit packs, e.g., 15, 16, and 20, as well as the optical fiber organizer, 24, are protected from the outside environment.

As illustrated in FIG. 2, the other portion, 12, of the cabinet includes additional electronic components, such as a standard cross-connect apparatus, illustrated schematically as block 22, and standard coaxial cable TV hardware such as a coaxial amplifier, 23, and a plurality of taps, 25. An aperture, 26, in the base, 30, of the cabinet permits entry of a plurality of cables, e.g., 50–53, into the cabinet portion, 12, from the ground on which the base is mounted. The cables may be connected so that, for example, the cross-connect apparatus provides connection to individual subscribers by means of cable 50, while the coaxial hardware, 23 and 25, receives rf signals from an input coaxial cable, 52, and transmits rf signals through output coaxial cable, 51. Wires, 53, from an incoming cable can be connected to connector, 27, to provide power to components in the portion 11. The cross-connect apparatus, 22, is coupled to the circuit packs, e.g., 15 and 16, by means of a wire, 40, passing through a grommetted aperture, 41, in the wall, 13.

The portions, 11 and 12, are enclosed by covers, 32 and 31, respectively, which are mounted on the base, 30, and secured to the cabinet by locks (not shown) attached to hasps, 33 and 36.

Figure 3:
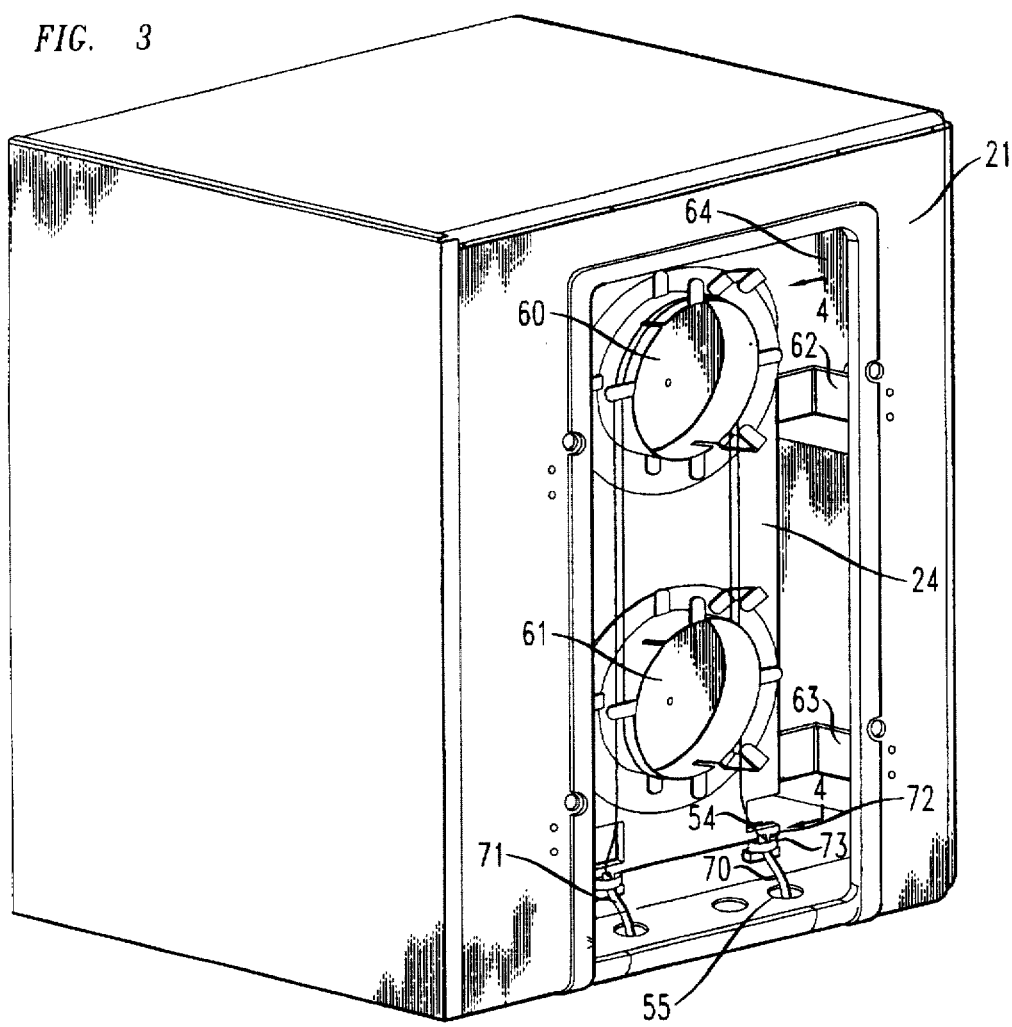
FIG. 3 is a more detailed perspective view of a portion of a cabinet in accordance with the same embodiment.

FIG. 3 illustrates a portion of the cabinet, 10, in greater detail in order to focus on a feature of the invention. FIG. 3 illustrates the optical fiber organizer, 24, which is mounted in a recess, 64, in the side surface, 21, of portion 11. The organizer, 24, may be the standard type for arranging optical fibers which includes a pair of spools, 60 and 61, for storing the fibers. The organizer may also include, for example, splice holders (not shown) for splicing various fibers. It will be appreciated that FIG. 3 illustrates only one fiber, 54, for the sake of clarity of illustration, but the organizer typically holds a multiplicity of fibers. The fibers enter and exit the recess, 64, within cables, 70 and 71, respectively, fed through grommetted apertures, e.g., 55, in the base, 30, in close proximity to the organizer (typically 5 cm to 10 cm from the aperture). The fibers can be used, for example, to carry telephone and switched digital video signals.

The cables, 70 and 71, are clamped to respective protrusions, e.g., 72, extending from the end of the fiber organizer, 24, by means such as standard hose clamps, e.g., 73.

Since the base, 30, of the cabinet is mounted on the ground, freezing temperatures cause the cabinet to move up and down as the ground freezes and thaws. This movement can be as much as 4 cm in the vertical direction. As the cabinet moves upward in previous designs, the components, such as the organizer, move with it thereby pulling on the fibers which are tautly connected thereto. This can cause an unacceptable strain on the fibers.

Figure 4:
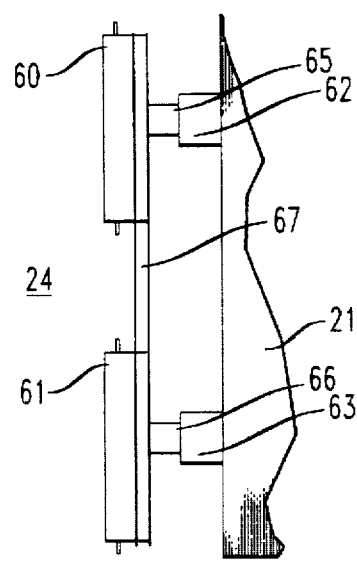
FIG. 4 is a view along line 44 of FIG. 3.

In order to deal with this problem, the organizer, 24, is slidably mounted to the cabinet so that as the cabinet moves up and down, the organizer will maintain the same position relative to the ground. This mounting is achieved, in this example, as illustrated in FIGS. 3 and 4. Two U-shaped brackets, 62 and 63, are mounted within the recess, 64, by means of rivets or other mechanical fasteners. Each bracket, 62 and 63, includes a magnet, 65 and 66, fixedly mounted to a portion thereof by adhesive. The magnets could be, for example, standard ferrite material. The organizer, 24, which has a metal base, 67, such as steel, is positioned on the magnets, 65 and 66. The magnetic force exerted by the magnets, 65 and 66, is sufficient to hold the organizer in place against the force of gravity. However, should the cabinet move upward, the tension supplied by the cables, 70 and 71, clamped to the organizer will keep the organizer in place with respect to ground as it slides with respect to the magnets. When the cabinet moves downward, the organizer is again held in place by the cables as it again slides with respect to the magnets. The amount of magnetic force required can be determined empirically according to the weight of the organizer and other factors such as vibration. In this example, the magnetic force was 10 pounds, but forces in the range of 1 to 30 pounds are generally useful.

It will be appreciated that in some cases, the brackets, 62 and 63, may be eliminated and the magnets, 65 and 66, mounted directly to the back wall of the recess, 64. Further, although the invention has been shown with respect to the organizer, 24, it will be realized that similar mounting means can be provided for other components which are capable of arranging copper conductors, such as cross-connect apparatus, 22, or coaxial hardware, 23 and 25, if it desired to lessen the strain on the cables, 50–52, coupled thereto.

The invention claimed is:

1. An electronics cabinet comprising:

a housing defining apertures for receiving conductors from below, ground;

means in close proximity to the apertures for arranging the conductors; and magnetic material mounted between the arranging means and the housing so that the arranging means is mounted to slide with respect to the housing in the event of movement of the housing.

2. The cabinet according to claim 1 wherein the conductors are optical fibers, and the arranging means is a fiber organizer including spools for storing the fibers.

3. The cabinet according to claim 2 further comprising brackets mounted to the housing so that the magnetic material is in contact therewith and the organizer is mounted to the brackets.

4. The cabinet according to claim 3 wherein the magnetic material exerts a magnetic force within the range 1 to 30 pounds.

5. The cabinet according to claim 1 wherein the cabinet is adapted for mounting on the ground and the arranging means is mounted to slide in the event of vertical movement of the housing.

* * * * *